(12) United States Patent
Alzheimer

(10) Patent No.: US 10,818,336 B2
(45) Date of Patent: Oct. 27, 2020

(54) APPARATUS WITH A ROW HIT RATE/REFRESH MANAGEMENT MECHANISM

(71) Applicant: Micron Technology, Inc., Boise, ID (US)

(72) Inventor: Joshua E. Alzheimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/692,391

(22) Filed: Nov. 22, 2019

(65) Prior Publication Data

US 2020/0143865 A1    May 7, 2020

Related U.S. Application Data

(63) Continuation of application No. 16/181,117, filed on Nov. 5, 2018, now Pat. No. 10,504,577.

(51) Int. Cl.
| | |
|---|---|
| *G11C 17/16* | (2006.01) |
| *G11C 11/406* | (2006.01) |
| *G11C 11/4091* | (2006.01) |
| *G06F 3/06* | (2006.01) |

(52) U.S. Cl.
CPC .......... *G11C 11/406* (2013.01); *G06F 3/0604* (2013.01); *G06F 3/0659* (2013.01); *G06F 3/0673* (2013.01); *G11C 11/4091* (2013.01)

(58) Field of Classification Search
CPC . G11C 11/406; G11C 11/4091; G06F 3/0604; G06F 3/0659; G06F 3/0673
USPC .......................................................... 365/222
See application file for complete search history.

(56) References Cited

U.S. PATENT DOCUMENTS

| | | |
|---|---|---|
| 10,157,658 B2 | 12/2018 | Jung |
| 2016/0086649 A1* | 3/2016 | Hong .................. G11C 29/783 365/96 |
| 2016/0351244 A1 | 12/2016 | Sohn et al. |
| 2017/0287547 A1 | 10/2017 | Ito et al. |
| 2018/0082736 A1 | 3/2018 | Jung |

* cited by examiner

*Primary Examiner* — Xiaochun L Chen
(74) *Attorney, Agent, or Firm* — Perkins Coie LLP

(57) ABSTRACT

The apparatus includes a row hammer refresh (RHR) circuit configured to steal a first refresh cycle to implement a first RHR segment; and steal a second refresh cycle after one or more operating cycles, the second refresh cycle to implement a second RHR segment.

20 Claims, 7 Drawing Sheets

FIG. 6A

RHR STEAL RA [13:11]=000   RHR_ADD RA12= 0

| RXADD_ADJ | | P0 | P1 | P2 | P3 | P4 | P5 |
|---|---|---|---|---|---|---|---|
| | RA13 | 0 | 0 | 0 | 1 | 1 | 1 |
| | RA12 | 0 | 1 | 0 | 1 | 0 | 0 |
| | RA11 | 0 | 0 | 0 | 0 | 0 | 0 |

| RXADD | | P0 | P1 | P2 | P3 | P4 | P5 |
|---|---|---|---|---|---|---|---|
| | RA13 | 0 | 0 | 0 | 1 | 1 | 1 |
| | RA12 | 0 | 0 | 0 | 0 | 1 | 0 |
| | RA11 | 0 | 0 | 0 | 0 | 0 | 0 |

FIG. 6B

RHR STEAL RA [13:11]=010   RHR_ADD RA12= 1

| RXADD_ADJ | | P0 | P1 | P2 | P3 | P4 | P5 |
|---|---|---|---|---|---|---|---|
| | RA13 | 0 | 0 | 0 | 1 | 1 | 1 |
| | RA12 | 1 | 0 | 1 | 0 | 1 | 1 |
| | RA11 | 0 | 0 | 0 | 0 | 0 | 0 |

| RXADD | | P0 | P1 | P2 | P3 | P4 | P5 |
|---|---|---|---|---|---|---|---|
| | RA13 | 0 | 0 | 0 | 1 | 1 | 1 |
| | RA12 | 0 | 0 | 0 | 0 | 0 | 0 |
| | RA11 | 0 | 0 | 0 | 0 | 0 | 0 |

FIG. 6C

RHR STEAL RA [13:11]=100   RHR_ADD RA12= 0

| RXADD_ADJ | | P0 | P1 | P2 | P3 | P4 | P5 |
|---|---|---|---|---|---|---|---|
| | RA13 | 1 | 0 | 1 | 1 | 0 | 1 |
| | RA12 | 0 | 1 | 0 | 1 | 0 | 0 |
| | RA11 | 0 | 0 | 0 | 0 | 0 | 0 |

| RXADD | | P0 | P1 | P2 | P3 | P4 | P5 |
|---|---|---|---|---|---|---|---|
| | RA13 | 0 | 0 | 0 | 1 | 1 | 1 |
| | RA12 | 0 | 0 | 0 | 0 | 1 | 0 |
| | RA11 | 0 | 0 | 0 | 0 | 0 | 0 |

FIG. 6D

RHR STEAL RA [13:11]=110   RHR_ADD RA12= 1

| RXADD_ADJ | | P0 | P1 | P2 | P3 | P4 | P5 |
|---|---|---|---|---|---|---|---|
| | RA13 | 1 | 0 | 0 | 1 | 1 | 1 |
| | RA12 | 1 | 0 | 1 | 0 | 1 | 1 |
| | RA11 | 0 | 0 | 0 | 0 | 0 | 0 |

| RXADD | | P0 | P1 | P2 | P3 | P4 | P5 |
|---|---|---|---|---|---|---|---|
| | RA13 | 0 | 0 | 0 | 1 | 1 | 1 |
| | RA12 | 0 | 0 | 0 | 0 | 0 | 0 |
| | RA11 | 0 | 0 | 0 | 0 | 0 | 0 |

APPARATUS WITH A ROW HIT RATE/REFRESH MANAGEMENT MECHANISM

CROSS-REFERENCE TO RELATED APPLICATION

This application is a continuation of U.S. application Ser. No. 16/181,117, filed Nov. 5, 2018; which is incorporated herein by reference in its entirety.

TECHNICAL FIELD

The disclosed embodiments relate to devices, and, in particular, to semiconductor memory devices with a row hit rate/refresh management mechanism.

BACKGROUND

An apparatus (e.g., a processor, a memory system, etc.) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data. For example, the memory devices can include Double Data Rate (DDR) RAM devices that implement DDR interfacing scheme (e.g., DDR4, DDR5, etc.) for high-speed data transfer.

With technological advancements in other areas and increasing applications, the market is continuously looking for faster, more efficient, and smaller devices. To meet the market demand, the semiconductor devices are being pushed to the limit. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

BRIEF DESCRIPTION OF THE DRAWINGS

FIG. 6A-FIG. 6D illustrate operation scenarios of the example address adjuster circuit of FIG. 5 in accordance with an embodiment of the present technology.

DETAILED DESCRIPTION

As described in greater detail below, the technology disclosed herein relates to an apparatus, such as memory systems, systems with memory devices, related methods, etc., for managing refresh operations including row hammer refresh (RHR) operations. Memory devices can experience data degradation due to the adverse effects of row hammer, in which charge can be lost in the cells of a word line when an adjacent or nearby word line is repeatedly activated/deactivated over a short period of time. The potential for adverse row hammer effects is further worsened for physically smaller memory devices, in which the distance between adjacent word lines decreases. To offset the potential for charge loss, the memory device can perform a RHR to refresh (e.g., compensate for the loss by recharging) the word lines that are adjacent to a hammered word line.

In some embodiments, the memory device can execute the RHR operation based on replacing/stealing a received refresh command with a RHR command, and then executing the refresh command at a later time after the RHR operation. For the RHR operation, the memory device can steal/use two pumps (e.g., a set of clock cycles required to implement a refresh operation at a memory location) of the refresh operation. For example, during traditional RHR operations, the memory device can steal the first two pumps for the RHR operation and then execute the commanded refresh operation during the following set (e.g., four) of pumps.

The apparatus (e.g., DRAM devices) can manage operations such that consecutive RHR operations do not share a common component or an execution timing across consecutive pumps. For example, the apparatus can ensure that the RHR operations do not share a common sense amplifier gap (e.g., a common location and/or grouping of sense amplifiers that are shared by adjacent memory sections). In some embodiments, the apparatus can ensure the separation of component/timing/segment across pumps by separating the pumps for the RHR steal such that they are not consecutive/adjacent. For example, the apparatus can implement one pump for the RHR steal, implement one or more pumps for the refresh operation (one or more scheduled refreshes), and then implement another pump for the RHR steal. To prevent sharing the sense amplifier gap across the RHR steal and the adjacent refresh, the apparatus can include logic within the bank that identifies sharing of the sense amplifier gap and adjusts accordingly. Accordingly, by ensuring that no consecutive operations share the sense amplifier gap in implementing the RHR operations, the apparatus can reduce precharge time (tRP) or recovery period and improve the overall speed and efficiency for the refresh/RHR operations.

Figure 1:
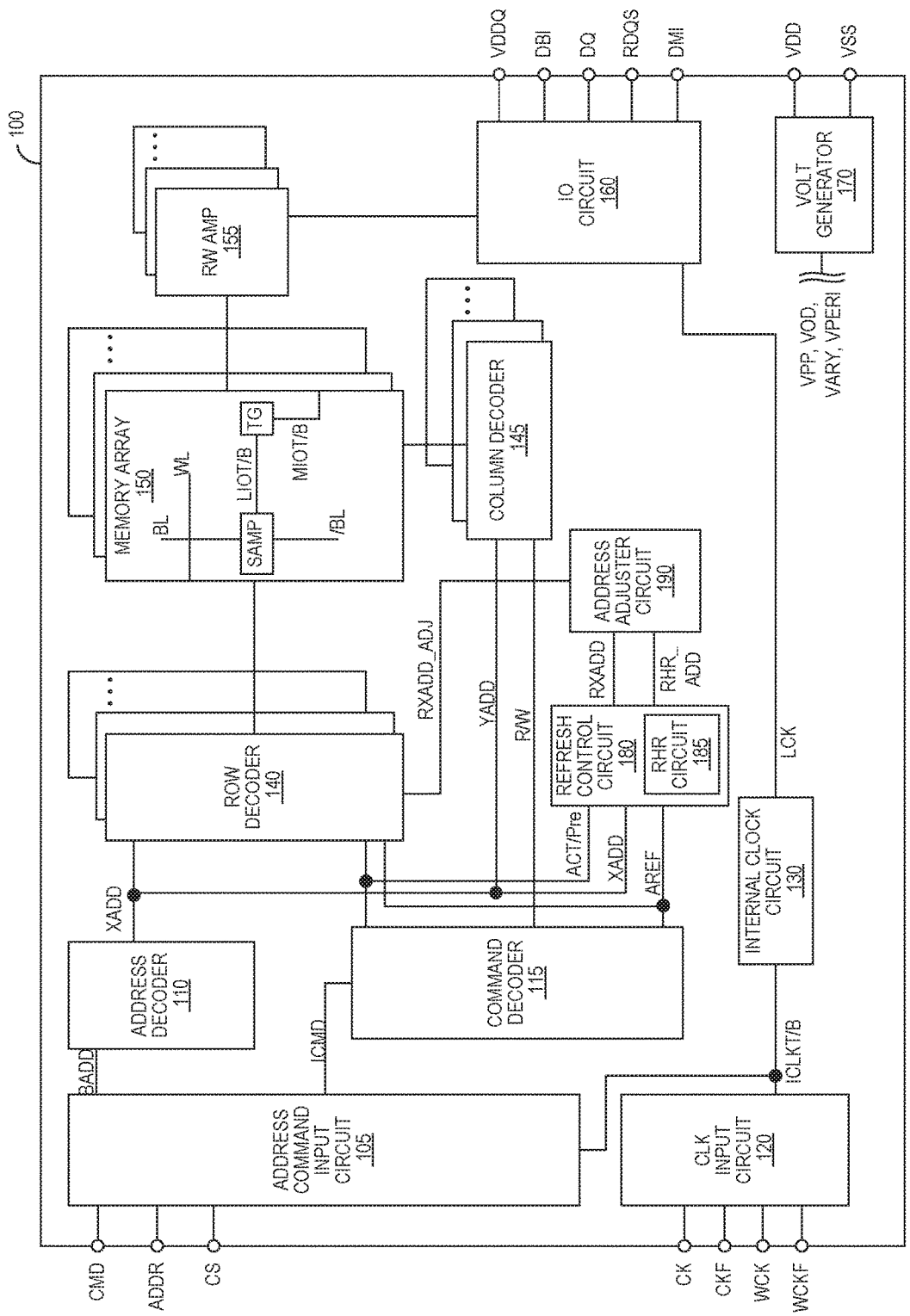
FIG. 1 is a block diagram of an apparatus in accordance with an embodiment of the present technology.

FIG. 1 is a block diagram of an apparatus 100 (e.g., a semiconductor die assembly, including a 3 DI device or a die-stacked package) in accordance with an embodiment of the present technology. For example, the apparatus 100 can include a DRAM (e.g., DDR3 DRAM, DDR4 DRAM, DDR5 DRAM, etc.), or a portion thereof that includes one or more dies/chips. In some embodiments, the apparatus 100 can include synchronous DRAM (SDRAM) of DDR type integrated on a single semiconductor chip.

The apparatus 100 may include an array of memory cells, such as memory array 150. The memory array 150 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register (not shown in FIG. 1). The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100, although in other embodiments, the host device may be indirectly connected to memory device (e.g., over a networked connection or through intermediary devices).

The apparatus 100 can include a refresh control circuit 180 configured to control refreshing of the information of the corresponding memory cell MC. For example, as inputs, the refresh control circuit 180 can receive the decoded row address signal (XADD) from the address decoder 110, a refresh signal (AREF) from the command decoder 115, an active signal (ACT) and/or a precharge signal (Pre) from the command decoder 115, etc. The command decoder 115 can generate the active signal (ACT) (e.g., a pulse signal) when the command signals (CMD) indicates row access (e.g., active command). The command decoder 115 can generate the precharge signal (Pre) (e.g., a pulse signal) when the command signal (CMD) indicates pre-charge. The command decoder 115 can generate the refresh signal (AREF) (e.g., a pulse signal) when the command signal (CMD) indicates an auto-refresh command and/or a self-refresh entry command. In response to the self-refresh entry command, the refresh signal (AREF) can be activated cyclically at a desired interval until a self-refresh exit command is received. In some embodiments, in response to the refresh signal (AREF), the refresh control circuit 180 can generate a refresh row address (RXADD) to the row decoder 140, which initiates the refresh operation therein (e.g., by activating a predetermined word line in the memory cell array). Accordingly, the apparatus 100 can implement a refresh operation (e.g., scheduled refreshes) to refresh (e.g., increase stored charges) targeted locations.

The refresh control circuit 180 can include a RHR control circuit 185 configured to control the RHR operation. The RHR control circuit 185 can be configured to control the RHR operation and refresh word lines that are adjacent to hammered (e.g., accessed more than a threshold amount of times over a predetermined period since the last refresh operation) word lines. In controlling the RHR, the RHR control circuit 185 can steal one or more pumps (e.g., predetermined durations or number of clock cycles for refreshing a word line or a set of cells) for the overall scheduled refresh operation. The apparatus 100 can use the stolen pumps to refresh victim rows (e.g., rows adjacent to the hammered row).

In contrast to circuits that steal preset (e.g., first two) pumps and/or adjacent pumps, the RHR control circuit 185 can be configured to dynamically manage the timing or sequence of the stolen pumps. The RHR control circuit 185 can be configured to coordinate execution of the RHR operation such that the RHR operations do not utilize or steal consecutive pumps. In some embodiments, the RHR control circuit 185 can include circuit components (e.g., logic, delays, buffers, flip-flops, etc.) configured to steal one pump and then delay for one or more pumps before stealing another pump, such that one or more of the pumps between the RHR steals are used for scheduled refreshes.

The RHR control circuit 185 can be further configured to generate a RHR address (RHR_ADD). The RHR address can identify the victim row (e.g., the row adjacent to the hammered row). In some embodiments, the RHR control circuit 185 can include counters that track row access and logic configured to compare the access count to a predetermined limit. When the access count reaches the limit, the RHR control circuit 185 can identify the corresponding row as the hammered row and adjacent row as the victim row. Based on identifying the victim row, the RHR control circuit 185 can generate the address of the victim row as the RHR address.

The RHR address (RHR_ADD) and the refresh row address (RXADD) can be provided to an address adjuster circuit 190. The address adjuster circuit 190 can be configured to further ensure that no consecutive pumps share the same sense amplifier gap. The address adjuster circuit 190 can be configured to compare the captured RHR address (RHR_ADD) and the scheduled refresh row address (RXADD), and generate an adjusted address (RXADD_ADJ) that separates sense amplifier gaps or consecutive sense amplifier access/use. In some embodiments, the address adjuster circuit 190 rearrange a sequence for the scheduled refresh row address. For example, the address adjuster circuit 190 can include logic configured to delay or change timing of row access for the scheduled refresh row address (RXADD).

As a result of stealing non-consecutive pumps (e.g., the configuration of the RHR control circuit 185), the apparatus 100 can separate the RHR operations in time such that they do not share the same sense amplifier gaps. Since RHR operations are likely to share the same sense amplifier gaps (e.g., such as by accessing the same sense amplifier), separating the access by one or more pumps can allow the sense amplifier to precharge and re-initialize before the next access. Also, as a result of further managing the sense amplifier access (e.g., the configuration of the address adjuster circuit 190), the apparatus 100 can further ensure that sense amplifier gaps do not overlap for the overall refresh operation. By preventing overlap in the sense amplifier gaps, the apparatus 100 can eliminate the need to wait for the sense amplifiers to equilibrate, thus reducing pre-charge time (tRP) (e.g., recovery period between refresh pumps).

Figure 2:
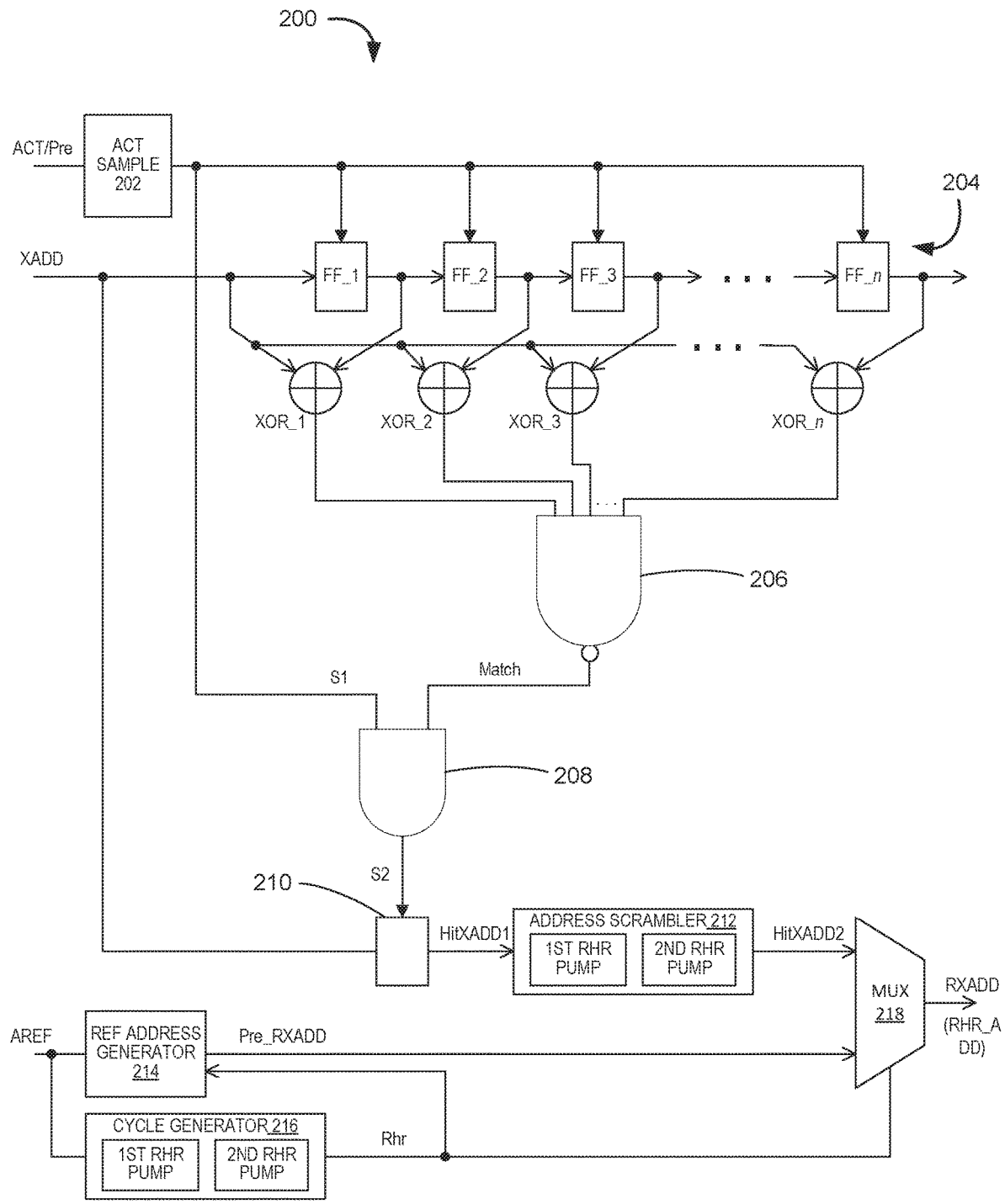
FIG. 2 is an example circuit diagram of a refresh control circuit in accordance with an embodiment of the present technology.

FIG. 2 is an example circuit diagram of a refresh control circuit 200 (e.g., an embodiment of the refresh control circuit 180 of FIG. 1) in accordance with an embodiment of the present technology. The refresh control circuit 200 can receive a refresh signal (AREF), an active signal (ACT), a pre-charge signal (Pre), a row address XADD, etc. from other circuits, such as the address decoder 110 of FIG. 1, the command decoder 115 of FIG. 1, etc.

In some embodiments, the refresh control circuit 200 can include a sampling signal generator 202, a shift register 204, etc. The sampling signal generator 202 can be configured to generate a first sampling signal (S1). The shift register 204 can be configured to implement shift operations synchronized with the first sampling signal (S1).

The sampling signal generator 202 can randomly extract the active signal (ACT) or the pre-charge signal (Pre), which is generated in response to an active command or a pre-charge command. The sampling signal generator 202 can output the signal as the first sampling signal (S1). The random extraction can be configured to control the sampling rate that optimizes the reliability of the Row Hammer refresh operations. The sampling signal generator 202 can control the sampling rate based on the appearance frequency of hammer addresses, the number of stages of the shift register 204, etc.

In some embodiments, the shift register 204 can include n-stages of flip-flop circuits (FF_1 to FF_n) in cascade connection for latching the row addresses (XADD). In other words, an output node of the flip-flop circuit of a former stage can be connected to an input node of the flip-flop circuit of a subsequent stage. The first sampling signal (S1) can be commonly input to clock nodes of the flip-flop circuits. As a result, when the first sampling signal (S1) is activated, the current row address (XADD) can be latched by the flip-flop circuit FF_1 of a first stage, and the row addresses (XADD) latched by the flip-flop circuits FF_1 to FF_n−1 can be respectively shifted to the flip-flop circuits FF_2 to FF_n of next stages. The row address (XADD) latched by the flip-flop circuit FF_n, which is a last stage, can be discarded in response to activation of the first sampling signal (S1).

The row addresses (XADD) latched by the flip-flop circuits FF_1 to FF_n can be supplied to first-side input nodes of corresponding comparator circuits XOR_1 to XOR_n, respectively. The current row address (XADD) can be supplied to second-side input nodes of the comparator circuits XOR_1 to XOR_n. As a result, if the current row address (XADD) matches any of the row addresses (XADD) latched by the flip-flop circuits FF_1 to FF_n, the output of the comparator circuit XOR_1 to XOR_n thereof can be activated to a low level. Accordingly, a match signal (Match) output from a NAND 206 can be activated to a high level.

The match signal (Match) and the first sampling signal (S1) can be supplied to an AND 208. When both of the match signal (Match) and the first sampling signal (S1) are activated to the high level, a second sampling signal (S2) output from the AND 208 can be activated to the high level. More specifically, if the row address (XADD) supplied when the first sampling signal (S1) is activated within past n-times matches the row address (XADD) supplied when the first sampling signal (S1) is currently activated, the second sampling signal S2 can be activated. In other words, the access to the word lines (WL) can be intermittently monitored, and, if the access to the same word line WL is captured two times or more within a predetermined period of time, the second sampling signal (S2) can be activated.

The second sampling signal S2 can be supplied to a latch circuit 210. The latch circuit 210 can be configured to latch the current row address (XADD) in response to the second sampling signal (S2). The latch circuit 210 can output the latched result to an address scrambler 212 as a row address (HitXADD1). The row address (HitXADD1) output from the latch circuit 210 can be considered to be the row address XADD of the word line WL having a high access frequency.

The address scrambler 212 can be configured to convert the row address (HitXADD1) output from the latch circuit 210 to a row address HitXADD2 of the word line WL affected by the highly-frequent access. In other words, the row address (HitXADD1) can be an aggressor address, and the row address (HitXADD2) can be a victim address. In many cases the victim address can be the address of the word line (WL) adjacent to the word line (WL) accessed by the aggressor address.

In some embodiments, the refresh control circuit 200 can include a refresh counter 214 and a refresh cycle generator 216. The refresh counter 214 can be configured to update a row address (Pre_RXADD) when the refresh signal (AREF) is activated. The row address (Pre_RXADD) can represent the address of the word line (WL) corresponding to the memory cell (MC) to be refreshed in response to the refresh signal (AREF). In other words, the row address (Pre_RXADD) can represent the address for the scheduled refresh operations. If an interrupt cycle signal (Rhr) generated by the refresh cycle generator 216 is activated, updates for the row address (Pre_RXADD) can be prohibited even if the refresh signal (AREF) is activated. Accordingly, the refresh control circuit 200 can "steal" one or more cycles to implement the RHR operation before the scheduled refresh operation. The refresh cycle generator 216 can be configured to activate the interrupt cycle signal (Rhr) in response to a predetermined number or pattern of activations of the refresh signal (AREF). For example, the refresh cycle generator 216 can be configured to activate the interrupt cycle signal (Rhr) every nine activations of the refresh command.

In some embodiments, the refresh control circuit 200 can include a multiplexer 218. The refresh control circuit 200 can be configured such that the multiplexer 218 receives the row address (HitXADD2) output from the address scrambler 212 and the row address (Pre_RXADD) output from the refresh counter 214. The multiplexer 218 can be configured to select either the row address (HitXADD2) or the row address (Pre_RXADD) as the refresh row address (RXADD). The selection can be carried out by the interrupt cycle signal (Rhr). For example, when the interrupt cycle signal (Rhr) is deactivated, the multiplexer 218 can select the row address (Pre_RXADD) output from the refresh counter 214 as the refresh row address (RXADD), such as for implementing the scheduled refresh operation. When the interrupt cycle signal (Rhr) is activated, the multiplexer 218 can select the row address (HitXADD2) output from the address scrambler 212.

In some embodiments, the address scrambler 212 can output the row addresses (HitXADD2) that correspond to two rows, where each of the rows are opposite the word line (WL) accessed by the aggressor address. The apparatus 100 of FIG. 1 can be configured to refresh each of the two victim rows. For example, the apparatus 100 can refresh (e.g., flush and reload) a first victim row in one operating cycle, and then refresh a second victim row in a latter operating cycle.

In one or more embodiments described below, the refresh control circuit 200 can be configured to separate the two victim row address by one or more operating cycles. For example, the address scrambler 212 can include a circuit to generate the address for the first victim row and a circuit to generate the address for the second victim row. In some embodiments, the second address can be generated after a delay. In some embodiments, the two victim address can be simultaneously passed to the multiplexer 218, and the multiplexer 218 can be configured to select the first victim row address based on a first interrupt (Rhr) and select the second victim row address based on a second interrupt (Rhr). Also, the refresh cycle generator 216 can include a circuit to generate the first interrupt signal and a circuit (e.g., a repeater with a predetermined delay) to generate the second interrupt separated by a predetermined number (e.g., one or more) of operating cycles relative to the first interrupt signal. The refresh counter 214 can be configured to output one or more scheduled refresh addresses between the first and second interrupt signals.

Figure 3:
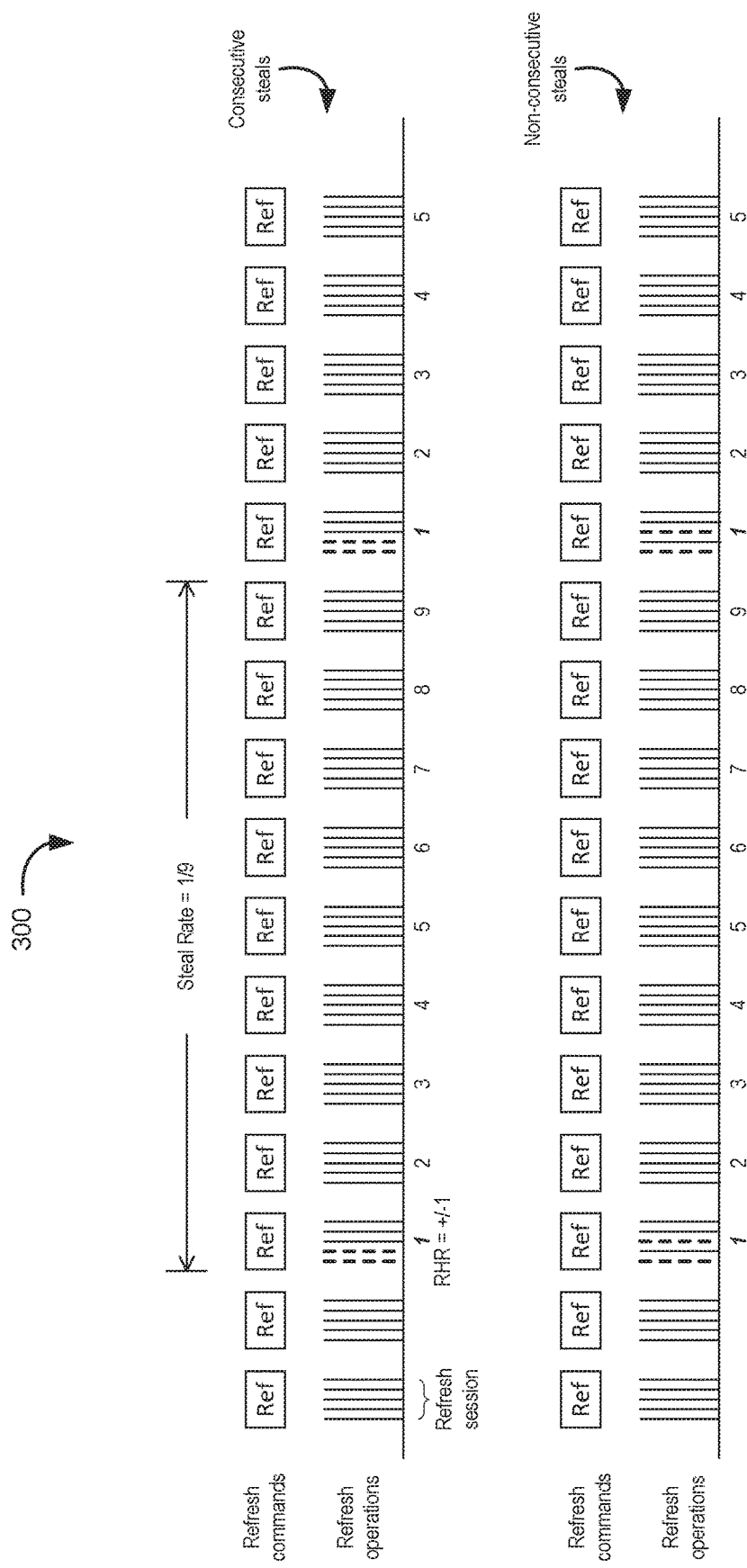
FIG. 3 illustrates overall timing diagrams of refresh operations in accordance with embodiments of the present technology.

FIG. 3 illustrates overall timing diagrams of refresh operations in accordance with embodiments of the present technology. The apparatus 100 of FIG. 1 can be configured to implement the RHR operations according to a steal rate. For example, with the steal rate of nine, the apparatus 100 (e.g., the cycle generator 216 of FIG. 2) can implement the RHR operations every nine refresh commands (e.g., AREF).

For each refresh command, the apparatus 100 can implement a refresh session that includes a set number of operating cycles or pumps (e.g., five as illustrated in FIG. 3). Without the RHR operations, the apparatus 100 can implement the scheduled refresh operations, illustrated using solid lines in FIG. 3. According to the steal rate, the apparatus 100 can implement the RHR operations on the corresponding refresh command. To implement the RHR operations, the apparatus 100 (e.g., the refresh control circuit 200) can steal a predetermined number of pumps. For example, the apparatus 100 can steal two pumps, each for refreshing one of two victim rows (e.g., rows x−1 and x+1) that surround the aggressor or hammered row (e.g., row x).

In some embodiments, the apparatus 100 can steal two consecutive pumps (e.g., the first two pumps out of the refresh session). In other embodiments, the apparatus 100 can steal a set (e.g., two) of non-consecutive pumps for implementing the RHR operation. Accordingly, the apparatus 100 can refresh one or more scheduled refresh locations between the RHR operations. As illustrated in the bottom example shown in FIG. 3, the apparatus 100 can steal the first pump and the third pump for the RHR operations.

In some embodiments, the apparatus 100 can implement the RHR operations for a set (e.g., three) of aggressor addresses. Accordingly, the apparatus 100 can steal corresponding sets of pumps (e.g., six, twelve, etc.). In some embodiments, the apparatus 100 can implement multiple flushes (e.g., erase and/or rewrite) for each memory location. For example, for implementing six flushes, the apparatus 100 can steal twelve pumps within a set of refresh commands (e.g., nine commands) that correspond to the steal rate.

Figure 4:
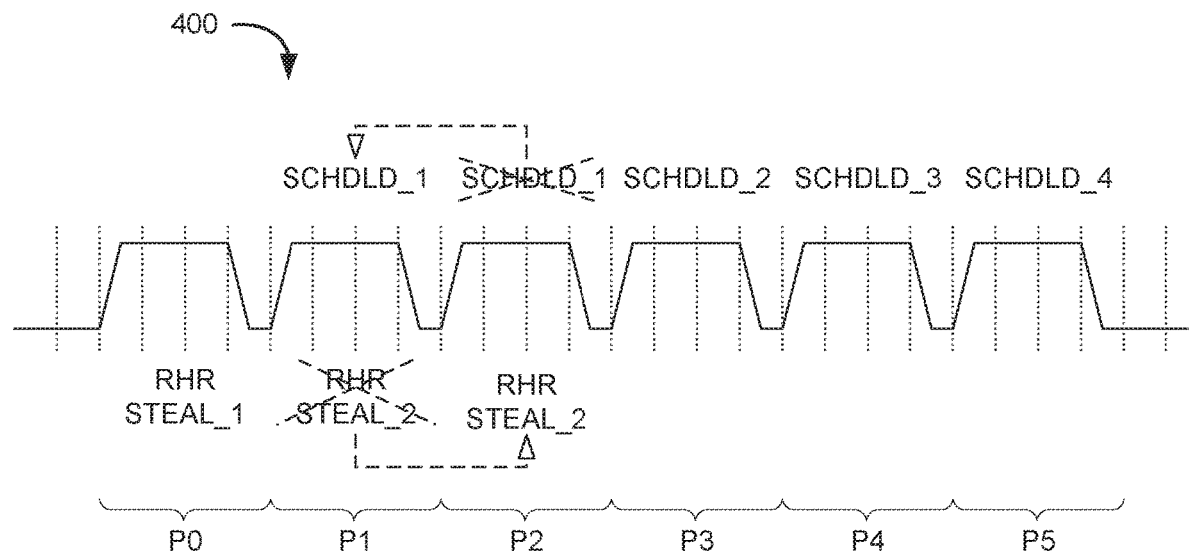
FIG. 4 illustrates a timing diagram of a refresh operation sequence in accordance with an embodiment of the present technology.

FIG. 4 illustrates a timing diagram of a refresh operation sequence 400 in accordance with an embodiment of the present technology. In some embodiments, the refresh control circuit 180 of FIG. 1 can generate the refresh operation sequence 400 based on stealing non-consecutive pumps to perform the RHR.

In some designs, the memory device can steal, such that first two pumps (e.g., P0 and P1) are dedicated to the RHR. In contrast, the refresh control circuit 180 can generate the refresh operation sequence 400 such that the two RHR steals are separated by one or more scheduled refresh pumps. For example, the refresh control circuit 180 can be configured to delay or wait one or more pumps between RHR steals. As illustrated in FIG. 4, the refresh control circuit 180 can be configured (e.g., using logic and/or a delay buffer) to steal the first pump (P0) and the third pump (P2) for the RHR. In some embodiments, the refresh control circuit 180 can be configured to perform one or more scheduled refresh operations between the two RHR steals.

Based on separating the RHR steals, the apparatus 100 of FIG. 1 can provide reduced precharge time (tRP) or recovery period. As discussed above, in some embodiments, the apparatus 100 is configured to refresh two victim rows surrounding the hammered row during RHR. As such, the two victim rows refreshed during RHR likely share the same sense amplifier and refreshing the two victim rows over two consecutive pumps will require sufficient precharge time between each refresh operation/pump that allows for the sense amplifiers to equilibrate. As such, separating the two RHR steals with one or more pumps in between can improve the likelihood that two consecutive pumps do not share the sense amplifier gap in implementing the RHR. By separating the sense amplifier access for RHR by one or more pumps, the sense amplifier for the RHR can use a succeeding pump to re-initialize or precharge instead of being limited to performing the re-initialization in between or during the pumps.

Figure 5:
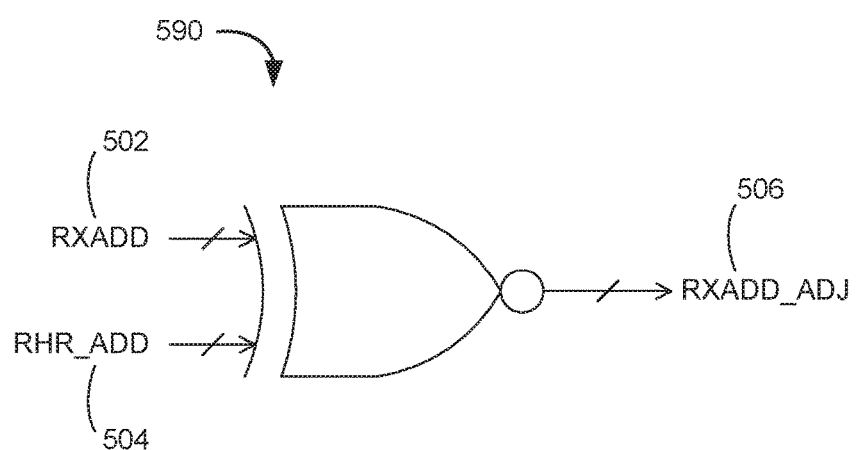
FIG. 5 illustrates an example address adjuster circuit in accordance with an embodiment of the present technology.

FIG. 5 illustrates an example address adjuster circuit 590 (e.g., the address adjuster circuit 190 of FIG. 1) in accordance with an embodiment of the present technology. As discussed above, the address adjuster circuit 590 can be configured to ensure that no consecutive pumps share the same sense amplifier gap. For example, the address adjuster circuit 590 can determine when an adjacent pair of stolen RHR pump and the scheduled refresh pump share the same sense amplifier gap. When the two adjacent pumps share the same sense amplifier gap, the address adjuster circuit 590 can rearrange the sequence by adjusting the steal timing and/or the scheduled refresh timing.

In some embodiments, the address adjuster circuit 590 can include an XNOR gate. The address adjuster circuit 590 can receive, such as from the RHR control circuit 185 of FIG. 1, a refresh row address (RXADD) 502 (e.g., a column access strobe (CAS) before row address strobe (RAS) refresh (CBR) address) and a RHR address (RHR_ADD) 504. Based on the received addresses, the address adjuster circuit 590 can generate an adjusted address (RXADD_ADJ) 506. Effectively, the address adjuster circuit 590 can generate the adjusted address 506 by switching an address or a bit that matches the RHR address to a subsequent pump. As illustrated in FIG. 5, the address adjuster circuit 590 can generate the adjusted address 506 according to:

$$RXADD\_ADJ[N:0]=!(RHR\_ADDR[N:0] \oplus RXADD[N:0]). \quad \text{Equation (1)}.$$

For Equation (1), 'N' can represent a number of terms being adjusted.

FIG. 6A through FIG. 6D illustrate operation scenarios of the example address adjuster circuit 590 of FIG. 5 in accordance with an embodiment of the present technology. FIGS. 6A-6D illustrate different combination of steal row addresses (RA) 11-13, where the value of RHR RA12 is passed through the address adjuster circuit 590, with the RHR steals occurring at first pump (P0 of FIG. 4) and third pump (P2 of FIG. 4) as illustrated by shaded column. Accordingly, each row can correspond to activation values of the RA11-13, and the columns can correspond to the pump sequence. The top grouping of row address values can represent the adjusted address (RXADD_ADJ) 506 of FIG. 5 resulting from applying XNOR to the RHR address (RHR_ADD) 504 of FIG. 5 values, shown on top, and the refresh row address (RXADD) 502 of FIG. 5 values, shown in the bottom grouping of row address values.

For example, FIG. 6A illustrates the scenario when the RHR RA is '000,' with the RHR RA12 being '0.' Accordingly, at both P0 and P2, the RHR RA corresponds to '000' across RA11-13. Focusing on RA12 values of the refresh row address 502, the '0' values occurring at P1 and P3 overlap with the '0' values occurring during the RHR steals at P0 and P2. Based on the XNOR operation, the RA12 values at P1 and P3 can be flipped to '1' in generating the adjusted address 506. At P4 and P5, the address adjuster circuit 590 can flip the '1' values of RXADD RA12 to generate the adjusted address 506 with '0' values for RA12 at P4 and P5. Effectively, the address adjuster circuit 590 can swap P1 and P3 with P4 and P5 to ensure that sense amplifier gaps are not shared between P0 and P1, P1 and P2, and P2 and P3.

FIG. 6B illustrates the scenario when the RHR RA is '010,' with the RHR RA12 being '1.' Accordingly, at both P0 and P2, the RHR RA corresponds to '010' across RA11-13. Since the RA12 values for the refresh row address 502 at P1 and P3 are '0' and different from the RHR RA12 value, no changes are made at P1, P3, P4, and P5 in generating the adjusted address 506.

FIG. 6C illustrates the scenario when the RHR RA is '100,' with the RHR RA12 being '0.' Accordingly, at both P0 and P2, the RHR RA corresponds to '100' across RA11-13. With the same RXADD RA12 value sequence as the first scenario in FIG. 6A, the address adjuster circuit 590 can generate a similar set of values for the adjusted address 506. For example, from the RXADD RA12 input, the address adjuster circuit 590 can flip the values at P1 and P3 to '1' and the values at P4 and P5 to '0' to generate the adjusted address 506.

FIG. 6D illustrates the scenario when the RHR RA is '110,' with the RHR RA12 being '1'. Accordingly, at both P0 and P2, the RHR RA corresponds to '110' across RA11-13. Similar to the second scenario illustrated in FIG. 6B, the RA12 values for the refresh row address 502 at P1 and P3 are '0' and different from the RHR RA12 value. As such, the address adjuster circuit 590 can generate the adjusted address 506 by passing the RXADD RA12 input without any changes.

Figure 7:
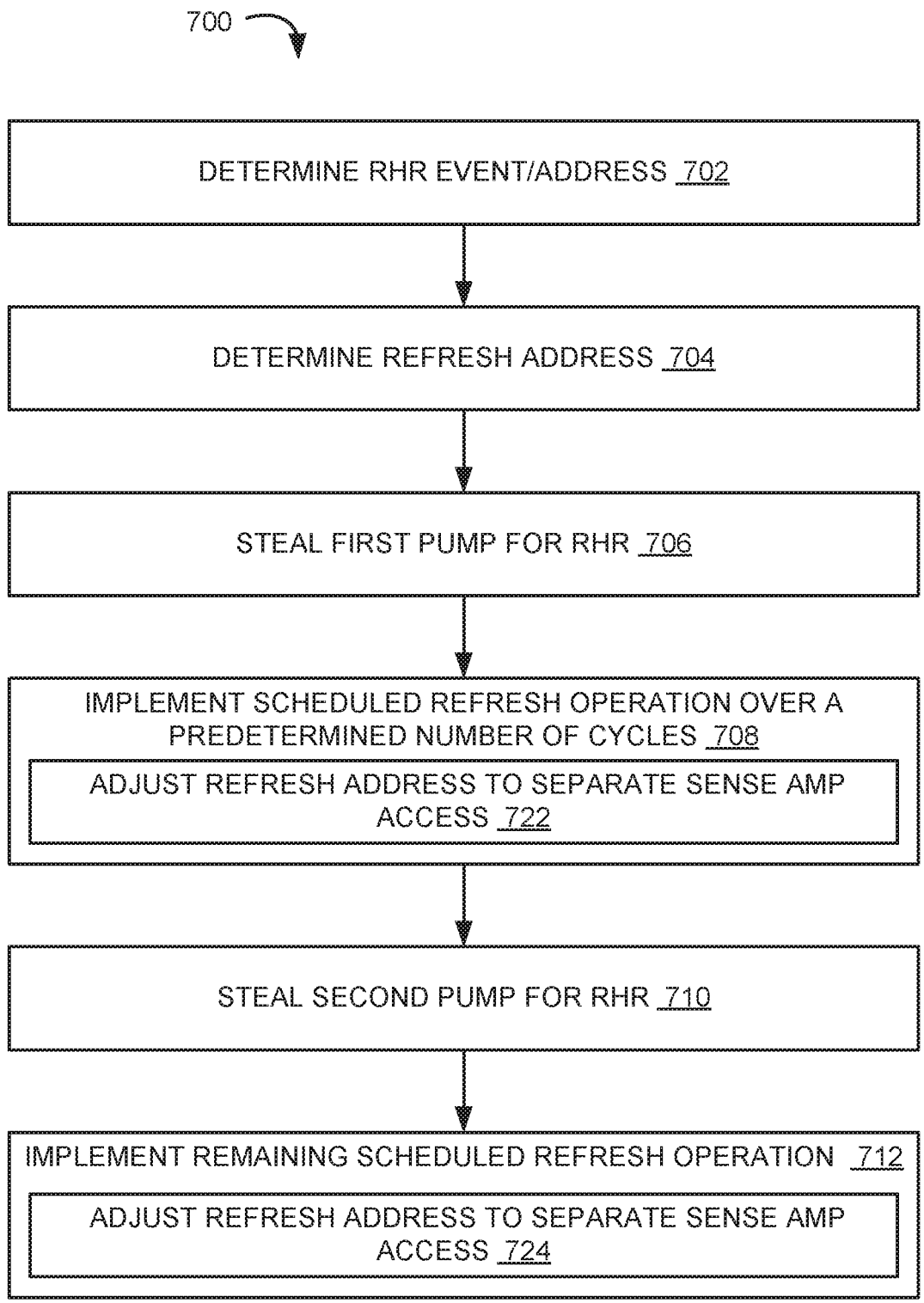
FIG. 7 is a flow diagram illustrating an example method of operating an apparatus in accordance with an embodiment of the present technology.

FIG. 7 is a flow diagram illustrating an example method 700 of operating an apparatus (e.g., the apparatus 100 of FIG. 1 or a portion therein) in accordance with an embodiment of the present technology. The method 700 can be for operating the refresh control circuit 180 of FIG. 1, the RHR control circuit 185 of FIG. 1, the address adjuster circuit 190 of FIG. 1, etc. The method 700 can be for managing the RHR steals to ensure that consecutive pumps do not share sense amplifier gaps.

At block 702, the apparatus 100 (e.g., the refresh control circuit 180 of FIG. 1, the RHR control circuit 185 of FIG. 1, etc.) can determine an RHR event and an associated address. In some embodiments, the apparatus 100 can determine an RHR event based on counting the number of row activations. The apparatus 100 can determine the RHR event when the number of row activations exceed a predetermined threshold. Based on the determination of the RHR event, the apparatus 100 can determine a victim row as the row adjacent to the hammered row (i.e., the row with the number of row activations exceeding the threshold).

The apparatus 100 can determine the address of the victim row as the RHR address 504 of FIG. 5 for the RHR operation (e.g., for refreshing the charge levels at the victim rows to compensate for possible charge losses from the row hammer event). Accordingly, the apparatus 100 can determine the RHR address 504 corresponding to a location of the memory array associated with the row hammer event and the RHR operation. The RHR address 504 can correspond to one or more sense amplifiers (SAMP) in the memory array 150 of FIG. 1.

At block 704, the apparatus 100 (e.g., the command/ address input circuit 105 of FIG. 1, the refresh control circuit 180, etc.) can determine a refresh address associated with the scheduled refresh operation (e.g., CBR). In some embodiments, the apparatus 100 can determine the refresh row address 502 of FIG. 5 corresponding to a location of the memory array associated with the scheduled refresh operation (e.g., CBR). For example, the apparatus 100 can determine the refresh row address 502 based on receiving (e.g., at the command/address input circuit 105) a command and a target address from an external source. Also for example, the apparatus 100 can determine the refresh row address 502 based on generating (e.g., at the refresh control circuit 180) the refresh row address 502 according to an elapsed duration from a write event or a previous refresh event. Similar to the RHR address 504, the refresh row address 502 can correspond to one or more sense amplifiers (SAMP) in the memory array 150.

At block 706, the apparatus 100 (e.g., the RHR control circuit 185) can steal a first pump for RHR or a portion thereof. The apparatus 100 can steal a pump for an overall memory refresh sequence (e.g., the overall refresh operation sequence 400 of FIG. 4) that refreshes charges stored at specified memory rows (e.g., the RHR address 504, the refresh row address 502, etc.). The apparatus 100 can steal based on temporarily holding a refresh command (e.g., for the scheduled refresh operation) received from a memory controller, and instead, implementing an RHR command or a portion thereof. The stolen or held command can be executed after the RHR operation. The overall memory refresh sequence can include the combination of the RHR operation and the scheduled refresh operation. In some embodiments, the apparatus 100 can steal the first pump of the overall memory refresh sequence.

The apparatus 100 (e.g., the row decoder 140 of FIG. 1, the memory array 150 of FIG. 1, etc.) can refresh victim row (e.g., the RHR address 504) or a portion thereof during the stolen pump. Accordingly, the apparatus 100 can implement a first portion (e.g., a first charge refresh step of an iterative or repetitive set of charge refresh steps, a first victim row from a set of victim rows, etc.) of the RHR operation during the first stolen pump.

At block 708, the apparatus 100 (e.g., the row decoder 140 of FIG. 1, the memory array 150 of FIG. 1, etc.) can implement the scheduled refresh operation or a portion thereof during a predetermined number of pumps. The apparatus 100 can implement the scheduled refresh operation or a portion thereof during one or more pumps after (e.g., immediately following) the stolen pump. In some embodiments, the apparatus 100 can use one pump to implement the scheduled refresh operation or a portion thereof after the first stolen pump. For the predetermined number of pumps, the RHR control circuit 185 can be configured to halt, such as for delaying the predetermined number of pumps between RHR steals.

At block 722, the apparatus 100 (e.g., the address adjuster circuit 190) can adjust the refresh address to separate sense amplifier access. For implementing the scheduled refresh after the stolen pump, the apparatus 100 can ensure that the sense amplifier gaps do not overlap across consecutive operating pumps. In some embodiments, the apparatus 100 can generate the adjusted address 506 of FIG. 5 based on the refresh row address 502 and the RHR address 504. The apparatus 100 can generate the adjusted address 506 to adjust activation of memory row in the refresh row address 502 for one or more operating pumps when the refresh row address 502 and the RHR address 504 correspond to accessing a recurring sense-amplifier over consecutive operating pumps. For example, the apparatus 100 can generate the adjusted address 506 that adjusts the refresh row address 502 (e.g., switching a row access from a target or an offending operating pump to a later operating pump) when it accesses the same sense amplifier as the preceding adjacent stolen pump (e.g., the RHR address 504). In some embodiments, the apparatus 100 can generate the adjusted address 506 using an XNOR device (e.g., the address adjuster circuit 590 of FIG. 5), such as by implementing an XNOR operation on the input signals (i.e., the refresh row address 502 and the RHR address 504).

At block 710, the apparatus 100 can steal a second pump for RHR or a portion thereof. The apparatus 100 can steal the second pump after executing the scheduled refresh operation or a portion thereof during a predetermined number of pumps. In some embodiments, the apparatus 100 can steal the second pump after implementing the scheduled refresh operation or a portion thereof over one pump. In some embodiments, the apparatus 100 (e.g., the refresh control circuit 180, the RHR control circuit 185, etc.) can steal the second pump based on tracking or counting the pumps or clock cycles since when the refresh command is received.

The apparatus 100 can steal the second pump similarly as described for block 706. The second stolen pump can be for implementing the second portion (e.g., a repeated refresh operation, a second row or location, etc.) of the RHR operation.

After stealing the second stolen pump and implementing a second portion of the RHR operation, such as at block 712, the apparatus 100 can implement a different portion of the scheduled refresh operation. The apparatus 100 can implement the scheduled refresh operation similarly as described for block 708, but for a different portion or memory location. In some embodiments, the apparatus 100 can implement the remaining scheduled refresh operation at a fourth pump (e.g., after the first stolen pump, one pump for a portion of the scheduled refresh operation, and the second stolen pump) and for a predetermined number of pumps (e.g., until sixth operating cycle or to the end of the overall memory refresh sequence). Also, at block 724, the apparatus 100 can adjust the refresh address to separate sense amplifier access (e.g., between the second stolen pump and the fourth pump). The apparatus 100 can adjust the refresh address similarly as described above at block 722.

When the scheduled refresh operations are implemented, the apparatus 100 can return to normal operation for reading and/or writing to the memory array. The apparatus 100 can continue with the normal operation until another refresh command is received or generated, at which point, the method can return to block 702.

For illustrative purposes, the method 700 is described using two stolen RHR pumps separated by one scheduled refresh operation. However, it is understood that the embodiments can be configured differently. In some embodiments, the apparatus 100 can iteratively steal additional (e.g., three or more) pumps for the RHR operations. In some embodiments, the apparatus 100 can steal the first and last pumps of the overall refresh operation.

Figure 8:
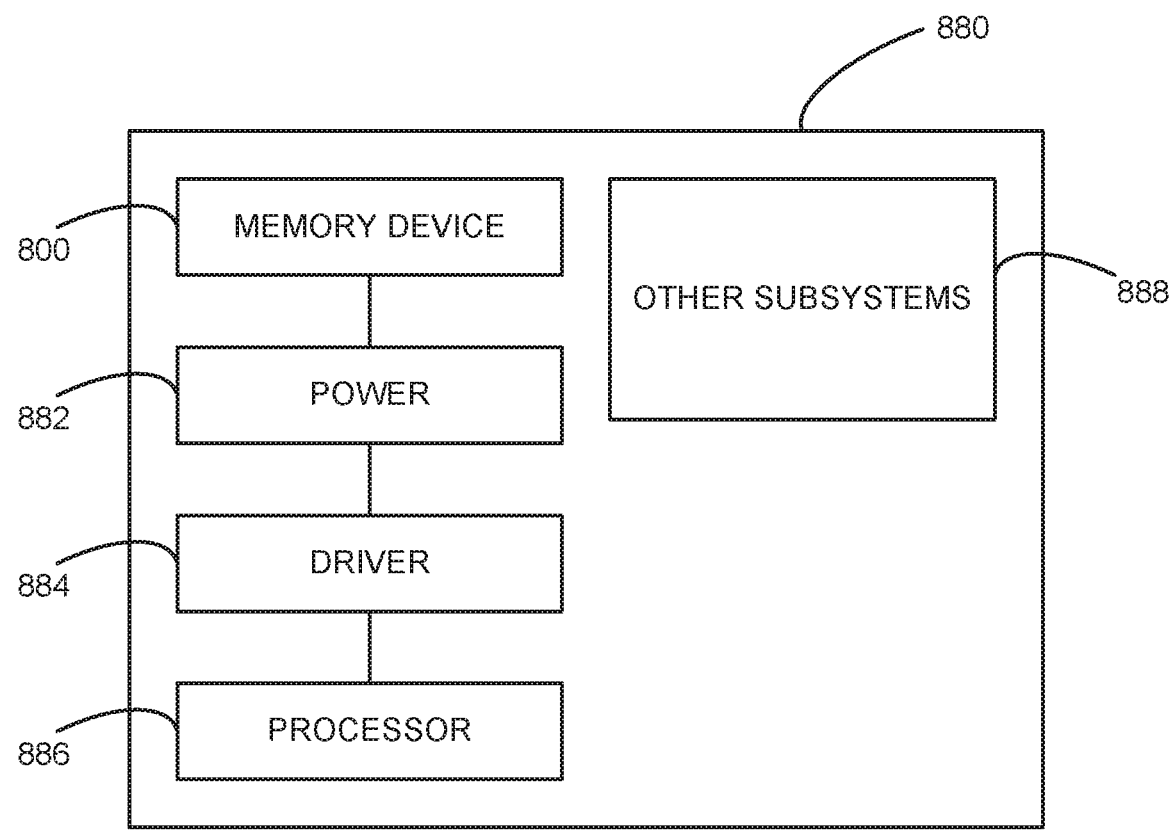
FIG. 8 is a schematic view of a system that includes an apparatus in accordance with an embodiment of the present technology.

FIG. 8 is a schematic view of a system that includes an apparatus in accordance with embodiments of the present technology. Any one of the foregoing apparatuses (e.g., memory devices) described above with reference to FIGS. 1-7 can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the apparatus described above with reference to FIGS. 1-7, and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-8.

I claim:

1. An apparatus, comprising:
a row hammer refresh (RHR) circuit configured to:
receive an AREF command,
determine a plurality of refresh cycles in series in response to the AREF command to perform a refresh operation on a portion of a memory array, and
steal a first refresh cycle and a second refresh cycle of the plurality of refresh cycles to perform a corresponding RHR operation in each of the first and second refresh cycles, wherein the second refresh cycle is non-adjacent to the first refresh cycle; and
a memory array operably coupled to the RHR circuit, the memory array is configured to:
implement the first portion of the RHR operation during the first refresh cycle, and
implement the second portion of the RHR operation during the second refresh cycle.

2. The apparatus of claim 1, wherein the memory array is configured to perform a scheduled refresh operation in a third refresh cycle of the plurality of refresh cycles, wherein the third refresh cycle is scheduled between the first and second refresh cycles.

3. The apparatus of claim 2, wherein:
the second refresh cycle is scheduled after the third refresh cycle; and
the memory array is configured to perform another scheduled refresh operation in a fourth refresh cycle of the plurality of refresh cycles, wherein the fourth refresh cycle is scheduled after the second refresh cycle.

4. The apparatus of claim 1, wherein the RHR circuit is configured to:
receive an additional AREF command issued next to the AREF command; and
determine a plurality of additional refresh cycles in series responsive to the additional AREF command, wherein any of the plurality of additional refresh cycles are not stolen for an additional corresponding RHR operation.

5. The apparatus of claim 1, wherein the memory array is configured to implement:
the refresh operation or a portion thereof after the first cycle,
the second portion of the RHR operation after implementing the refresh operation or a portion thereof, and
a different portion of the scheduled refresh operation after implementing the second portion of the RHR.

6. The apparatus of claim 1, wherein the RHR circuit is configured to delay a predetermined number of the refresh cycles between stealing the first refresh cycle and the second refresh cycle.

7. The apparatus of claim 6, wherein the RHR circuit is configured to separate the first refresh cycle and the second refresh cycle by one refresh cycle.

8. The apparatus of claim 7, wherein the RHR circuit is configured to steal a first refresh cycle and a third refresh cycle in a sequence of the plurality of refresh cycles.

9. The apparatus of claim 1, further comprising an address adjuster circuit operably coupled to the RHR circuit, the address adjuster circuit configured to:
receive a refresh address corresponding to a location of the memory array associated with the scheduled refresh operation;
receive an RHR address corresponding to a different location of the memory array associated with the RHR operation; and
generate an adjusted address based on the refresh address and the RHR address, the adjusted address to replace the refresh address for one or more operating cycles.

10. The apparatus of claim 9, wherein:
the refresh address and the RHR address each corresponds to one or more sense amplifiers; and
when the refresh address and the RHR address correspond to accessing a recurring sense-amplifier over consecutive operating cycles, the address adjuster circuit is configured to generate the adjusted address that separates access to the recurring sense-amplifier by one or more operating cycles between the accessing cycles.

11. The apparatus of claim 10, wherein the address adjuster circuit includes an XNOR logic device to generate the adjusted address based on implementing an XNOR operation on the refresh address and the RHR address.

12. The apparatus of claim 1, wherein:
the memory array is configured to store segments of electrical charges, wherein each of the segments of electrical charges represent a data value;
the scheduled refresh operation is implemented to refresh memory locations according to a schedule or an external command; and
the RHR operation is implemented to refresh victim locations adjacent to a hammered row, wherein the hammered row is a set of locations in the memory array that has been accessed more than a threshold number of times during one or more memory operations.

13. A method of operating an apparatus, the method comprising:
receiving an AREF command;
determining a plurality of refresh cycles in series responsive to the AREF command; and
stealing a first stolen cycle and a second refresh cycle of the plurality of refresh to perform a corresponding row hammer refresh (RHR) operation in each of the first and second refresh cycles, wherein the first and second refresh cycles are scheduled not to be adjacent to each other.

14. The method of claim 13, further comprising:
performing a scheduled refresh operation in a third refresh cycle of the plurality of refresh cycles which is scheduled between the first and second refresh cycles.

15. The method of claim 14, wherein:
the second refresh cycle is scheduled after the third refresh cycle; and
further comprising:
performing another scheduled refresh operation in a fourth refresh cycle of the plurality of refresh cycles which is scheduled after the second refresh cycle.

16. The method of claim 13, further comprising:
receiving an additional AREF command which is issued next to the AREF command; and
determining a plurality of additional refresh cycles in series responsive to the additional AREF command, wherein any of the plurality of additional refresh cycles are not stolen for an additional corresponding RHR operation.

17. The method of claim 13, wherein:
stealing the first refresh cycle includes stealing a first cycle in the plurality of the refresh sequence; and
stealing the second refresh cycle includes stealing a third cycle in the plurality of the refresh sequence.

18. The method of claim 13, further comprising:
determining a refresh address corresponding to a location of the memory array associated with the scheduled refresh operation;
determining an RHR address corresponding to a different location of the memory array associated with a row hammer event and the RHR operation; and
generating an adjusted address based on the refresh address and the RHR address, the adjusted address to adjust activation of memory row in the refresh address for one or more operating cycles.

19. An apparatus, comprising:
a row hammer refresh (RHR) circuit configured to:
implement a first RHR segment, and
implement a second RHR segment after one or more operatic cycles following the first RHR segment; and
an address adjuster circuit operably coupled to the RHR circuit, the address adjuster circuit configured to:
receive a refresh address corresponding to a location of the memory array associated with a scheduled refresh operation;
receive an RHR address corresponding to a different location of the memory array associated with the RHR operation; and
generate an adjusted address based on the refresh address and the RHR address, the adjusted address to replace the refresh address for one or more operating cycles.

20. The apparatus of claim 19, wherein the address adjuster circuit comprises an XNOR device.

* * * * *